United States Patent
Funakawa

(10) Patent No.: US 6,922,418 B2
(45) Date of Patent: Jul. 26, 2005

(54) WAVELENGTH-VARIABLE LIGHT SOURCE APPARATUS

(75) Inventor: Seiji Funakawa, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 136 days.

(21) Appl. No.: 10/382,632

(22) Filed: Mar. 7, 2003

(65) Prior Publication Data

US 2003/0165166 A1 Sep. 4, 2003

Related U.S. Application Data

(62) Division of application No. 09/239,791, filed on Jan. 29, 1999, now Pat. No. 6,542,523.

(30) Foreign Application Priority Data

Jan. 30, 1998 (JP) ............................................ 10-019796
Jan. 30, 1998 (JP) ............................................ 10-019797

(51) Int. Cl.$^7$ ................................................ H01S 3/10
(52) U.S. Cl. ............................ 372/20; 372/43; 372/44; 372/45; 372/46
(58) Field of Search ........................... 372/20, 23, 29.02

(56) References Cited

U.S. PATENT DOCUMENTS

| | | | | |
|---|---|---|---|---|
| 3,800,243 A | | 3/1974 | Wrobel ...................... 331/94.5 |
| 4,835,782 A | * | 5/1989 | Kaede et al. .................. 372/32 |
| 4,977,564 A | | 12/1990 | Ryu et al. ..................... 372/32 |
| 5,442,651 A | | 8/1995 | Maeda ........................ 372/97 |
| 5,450,207 A | * | 9/1995 | Fomenkov .................. 356/416 |
| 5,491,714 A | | 2/1996 | Kitamura ..................... 372/92 |
| 5,493,575 A | | 2/1996 | Kitamura ..................... 372/20 |
| 5,544,183 A | * | 8/1996 | Takeda ........................ 372/26 |
| 5,548,609 A | * | 8/1996 | Kitamura ..................... 372/92 |
| 5,949,562 A | | 9/1999 | Kubota ....................... 359/124 |
| 5,982,794 A | * | 11/1999 | Tamura ................. 372/29.012 |
| 6,278,797 B1 | * | 8/2001 | Nagasaki et al. ........... 382/146 |

FOREIGN PATENT DOCUMENTS

JP  2-306679  12/1990

OTHER PUBLICATIONS

European Patent Office Standard Search Report dated Apr. 17, 2001 for Application No. 99101534.8–2214.

* cited by examiner

*Primary Examiner*—Don Wong
*Assistant Examiner*—Dung T. Nguyen
(74) *Attorney, Agent, or Firm*—Finnegan, Henderson, Farabow, Garrett, & Dunner, L.L.P.

(57) ABSTRACT

A wavelength-variable light source apparatus having a wavelength calibration function of emitted light therefrom. The apparatus includes a semiconductor laser light source section, an external resonance section having a reflection surface for externally resonating emitted light from the semiconductor laser light source section at a predetermined reflection wavelength, a drive section for moving a position of the reflection surface in the external resonance section for varying an external resonance condition, a control section for controlling a variable move distance of the reflection surface in the drive section, and a wavelength detection section comprising a gas cell having a wavelength absorption characteristic absorbing light at a plurality of specific wavelengths for sweeping light emitted from the external resonance section into the gas cell and detecting an absorption wavelength of the emitted light, wherein the control section controls the move distance of the reflection surface in the drive section based on the absorption wavelength detected by the wavelength detection section.

4 Claims, 11 Drawing Sheets

FIG. 3

| 12 ACETYLENE | | | 13 ACETYLENE | | |
|---|---|---|---|---|---|
| LINE | FREQUENCY (MHz) | WAVELENGTH (nm) | LINE | FREQUENCY (MHz) | WAVELENGTH (nm) |
| | | | P30 | 193220004.7 | 1.551560142 |
| | | | P29 | 193306464.3 | 1.550866181 |
| | | | P28 | 193392325.0 | 1.550177640 |
| | | | P27 | 193477463.9 | 1.549495492 |
| | | | P26 | 193561931.2 | 1.548819316 |
| | | | P25 | 193645722.2 | 1.548149138 |
| | | | P24 | 193728847.3 | 1.547484859 |
| | | | P23 | 193811293.5 | 1.546826568 |
| | | | P22 | 193893066.7 | 1.546174204 |
| P21 | 194916199.6 | 1.538058195 | P21 | 193974166.4 | 1.545527755 |
| P20 | 195001916.0 | 1.537382115 | P20 | 194054593.0 | 1.544887206 |
| P19 | 195086887.0 | 1.536712501 | P19 | 194134346.6 | 1.544252541 |
| P18 | 195171111.0 | 1.536049349 | P18 | 194213427.2 | 1.543623746 |
| P17 | 195254586.9 | 1.535392652 | P17 | 194291835.0 | 1.543000806 |
| P16 | 195337313.0 | 1.534742407 | P16 | 194369569.4 | 1.542383712 |
| P15 | 195419288.1 | 1.534098609 | P15 | 194446632.3 | 1.541772436 |
| P14 | 195500510.6 | 1.533461253 | P14 | 194523020.6 | 1.541166990 |
| P13 | 195580979.3 | 1.532830335 | P13 | 194598735.3 | 1.540567350 |
| P12 | 195660692.5 | 1.532205852 | P12 | 194673775.9 | 1.539973510 |
| P11 | 195739649.3 | 1.531587796 | P11 | 194748141.5 | 1.539385463 |
| P10 | 195817848.2 | 1.530976163 | P10 | 194821826.4 | 1.538803241 |
| P9 | 195895287.9 | 1.530370951 | P9 | 194894848.5 | 1.538226691 |
| P8 | 195971967.0 | 1.529772154 | P8 | 194967189.0 | 1.537655949 |
| P7 | 196047884.4 | 1.529179766 | P7 | 195038865.7 | 1.537090861 |
| P6 | 196123038.5 | 1.528593786 | P6 | 195109854.5 | 1.536531606 |
| P5 | 196197428.2 | 1.528014209 | P5 | 195180187.7 | 1.535977916 |
| P4 | 196271052.5 | 1.527441027 | P4 | 195249863.8 | 1.535429793 |
| P3 | 196343910.1 | 1.526874238 | P3 | 195318891.7 | 1.534887155 |
| R2 | 196764884.4 | 1.523607522 | P2 | 195387280.1 | 1.534349922 |
| R3 | 196832340.8 | 1.523085367 | P1 | 195455036.5 | 1.533818025 |
| R4 | 196899021.3 | 1.522569569 | R0 | 195588662.4 | 1.532770122 |
| R5 | 196964924.6 | 1.522060126 | R1 | 195654525.2 | 1.532254149 |
| R6 | 197030049.1 | 1.521557038 | R2 | 195749743.4 | 1.531743568 |
| R7 | 197094394.8 | 1.521060293 | R3 | 195784305.9 | 1.531238455 |
| R8 | 197157960.0 | 1.520569892 | R4 | 195848201.4 | 1.530738888 |
| R9 | 197220743.7 | 1.520085831 | R5 | 195911420.8 | 1.530244928 |
| R10 | 197282744.7 | 1.519608106 | R6 | 195973956.4 | 1.529756624 |
| R11 | 197343962.4 | 1.519136711 | R7 | 196035803.0 | 1.529274007 |
| R12 | 197404395.5 | 1.518671645 | R8 | 196096949.8 | 1.528797150 |
| R13 | 197464043.3 | 1.518212901 | R9 | 196157413.7 | 1.528325911 |
| R14 | 197522904.4 | 1.517760479 | R10 | 196217174.2 | 1.527860440 |
| R15 | 197580978.4 | 1.517314371 | R11 | 196276235.3 | 1.527400694 |
| R16 | 197638264.0 | 1.516874576 | R12 | 196334595.3 | 1.526946678 |
| R17 | 197694760.2 | 1.516441092 | R13 | 196392253.0 | 1.526498390 |
| R18 | 197750466.6 | 1.516013910 | R14 | 196449205.0 | 1.526055848 |
| | | | R15 | 196505452.6 | 1.525619030 |
| | | | R16 | 196560991.4 | 1.525187962 |
| | | | R17 | 196615819.9 | 1.524762647 |
| | | | R18 | 196669936.0 | 1.524343090 |
| | | | R19 | 196723337.4 | 1.523929301 |
| | | | R20 | 196776021.7 | 1.523521288 |
| | | | R21 | 196827987.0 | 1.523119057 |
| | | | R22 | 196879230.9 | 1.522722618 |
| | | | R23 | 196929745.9 | 1.522332020 |

FIG. 7

CALCULATION DIRECTION →

| NO. OF PULSES | MOTOR MOVE DISTANCE Δ | ANGLE β | WAVELENGTH λ | ANGLE β | MOTOR MOVE DISTANCE Δ | NO. OF PULSES |
|---|---|---|---|---|---|---|
| | m | RAD | m | RAD | m | |
| 0 | 0.00E+00 | 0.3249189 | 1.4550000E-06 | 0.3249189 | 0.00E+00 | 0 |
| 1000 | 1.50E-05 | 0.3252189 | 1.4553159E-06 | 0.3252189 | 1.50E-05 | 1000 |
| 2000 | 3.00E-05 | 0.3255189 | 1.4556317E-06 | 0.3255189 | 3.00E-05 | 2000 |
| 3000 | 4.50E-05 | 0.3258189 | 1.4559475E-06 | 0.3258189 | 4.50E-05 | 3000 |
| 4000 | 6.00E-05 | 0.3261189 | 1.4562633E-06 | 0.3261189 | 6.00E-05 | 4000 |
| 5000 | 7.50E-05 | 0.3264189 | 1.4565791E-06 | 0.3264189 | 7.50E-05 | 5000 |
| 6000 | 9.00E-05 | 0.3267189 | 1.4568948E-06 | 0.3267189 | 9.00E-05 | 6000 |
| 7000 | 1.05E-04 | 0.3270189 | 1.4572105E-06 | 0.3270189 | 1.05E-04 | 7000 |
| 8000 | 1.20E-04 | 0.3273189 | 1.4575261E-06 | 0.3273189 | 1.20E-04 | 8000 |
| 9000 | 1.35E-04 | 0.3276189 | 1.4578417E-06 | 0.3276189 | 1.35E-04 | 9000 |
| 10000 | 1.50E-04 | 0.3279189 | 1.4581573E-06 | 0.3279189 | 1.50E-04 | 10000 |
| 11000 | 1.65E-04 | 0.3282189 | 1.4584729E-06 | 0.3282189 | 1.65E-04 | 11000 |
| 12000 | 1.80E-04 | 0.3285189 | 1.4587884E-06 | 0.3285189 | 1.80E-04 | 12000 |
| 13000 | 1.95E-04 | 0.3288189 | 1.4591039E-06 | 0.3288189 | 1.95E-04 | 13000 |
| 14000 | 2.10E-04 | 0.3291189 | 1.4594193E-06 | 0.3291189 | 2.10E-04 | 14000 |
| 15000 | 2.25E-04 | 0.3294189 | 1.4597347E-06 | 0.3294189 | 2.25E-04 | 15000 |
| 16000 | 2.40E-04 | 0.3297189 | 1.4600501E-06 | 0.3297189 | 2.40E-04 | 16000 |
| 17000 | 2.55E-04 | 0.3300189 | 1.4603655E-06 | 0.3300189 | 2.55E-04 | 17000 |
| 18000 | 2.70E-04 | 0.3303188 | 1.4606808E-06 | 0.3303188 | 2.70E-04 | 18000 |
| 19000 | 2.85E-04 | 0.3306188 | 1.4609961E-06 | 0.3306188 | 2.85E-04 | 19000 |
| 20000 | 3.00E-04 | 0.3309188 | 1.4613113E-06 | 0.3309188 | 3.00E-04 | 20000 |
| 21000 | 3.15E-04 | 0.3312188 | 1.4616266E-06 | 0.3312188 | 3.15E-04 | 21000 |
| 22000 | 3.30E-04 | 0.3315188 | 1.4619418E-06 | 0.3315188 | 3.30E-04 | 22000 |
| 23000 | 3.45E-04 | 0.3318188 | 1.4622569E-06 | 0.3318188 | 3.45E-04 | 23000 |
| 24000 | 3.60E-04 | 0.3321188 | 1.4625720E-06 | 0.3321188 | 3.60E-04 | 24000 |
| 25000 | 3.75E-04 | 0.3324188 | 1.4628871E-06 | 0.3324188 | 3.75E-04 | 25000 |
| 400000 | 6.00E-03 | 0.4443478 | 1.5779302E-06 | 0.4443478 | 6.00E-03 | 400000 |
| 500000 | 7.50E-03 | 0.4738088 | 1.6072743E-06 | 0.4738088 | 7.50E-03 | 500000 |

WAVELENGTH-VARIABLE LIGHT SOURCE APPARATUS

This is a divisional of application Ser. No. 09/239,791, filed Jan. 29, 1999, now U.S. Pat. No. 6,542,523 which is incorporated herein by reference.

BACKGROUND OF THE INVENTION

1. Field of the Invention

This invention relates to a wavelength-variable light source apparatus having a wavelength calibration function of emitted light therefrom.

2. Description of the Related Art

Hitherto, normally a semiconductor laser of an external resonator type, which will be hereinafter referred to as LD, has been used as a wavelength-variable light source and an optical filter which is a wavelength selection element has been inserted into an external resonator for providing single-mode oscillation. The wavelength passing through (or reflected on) the optical filter is made mechanically variable, thereby enabling wavelength sweeping in a wide range.

Such a wavelength-variable light source is used to measure the optical characteristics of an optical filter, a communication optical fiber, and the like. Before the measurement conditions are set, it is necessary to calibrate the wavelength of the current light oscillated from the wavelength-variable light source in response to the measurement environment (ambient temperature and the like). For example, a measuring instrument with the wavelength accuracy checked such as a wave meter using a Fabry-Perot interferometer is used to calibrate the wavelength of the wavelength-variable light source.

However, to measure the optical characteristics of an optical filter, a communication optical fiber, and the like, using the conventional wavelength-variable light source, a measuring instrument with the wavelength accuracy checked such as a wave meter needs to be used to calibrate the wavelength of the wavelength-variable light source, thus the wavelength calibration requires a lot of time and labor and an expensive wave meter must be provided, impeding the effective use of the wavelength-variable light source.

Since the wave meter is of large size relative to the main part of the wavelength-variable light source, upsizing and high costs of the wavelength-variable light source result from containing the wave meter in the wavelength-variable light source.

Incidentally, FIG. 11 shows an example of a wavelength-variable light source apparatus using a wavelength-variable light source. A wavelength-variable light source apparatus 101 shown in FIG. 11 is made up of a wavelength-variable light source section 102, a wavelength-variable drive section 103, a drive control section 104, a control section 105, a central processing unit (CPU) 106, a read-only memory (ROM) 107, an LD drive section 108, and a light detection section 109.

The wavelength-variable light source section (TLS) 102 uses an LD of an external resonator type. The mechanical position of an optical filter forming a part of an external resonator is moved by the wavelength-variable drive section 103, whereby the external resonance condition is varied and the wavelength of emitted light can be made variable in a wide range.

The wavelength-variable drive section 103, which is made up of a pulse motor and the like, moves the mechanical position of the optical filter in the wavelength-variable light source section 102 in response to a drive control signal input from the drive control section 104 and outputs a position signal indicating the move position of the optical filter to the drive control section 104 as a rotary encode signal of the pulse motor. The drive control section 104 generates a drive control signal in response to a wavelength-variable control signal input from the control section 105 and outputs the drive control signal to the wavelength-variable drive section 103 and also outputs the position signal (rotary encode signal) input from the wavelength-variable drive section 103 to the control section 105.

The control section 105 has a function of controlling the relationship between the move position of the optical filter in the wavelength-variable light source section 102 and the wavelength of emitted light. The control section 105 generates a wavelength-variable control signal in response to a wavelength-variable instruction signal input from the CPU 106 and outputs the wavelength-variable control signal to the drive control section 104 for setting the wavelength of emitted light. The control section 105 also checks that the emitted light is set to the set wavelength based on the position signal (rotary encode signal) input from the drive control section 104, then stops the drive control. Further, the control section 105 converts the position signal (rotary encode signal) input from the drive control section 104 into position data and outputs the position data to the CPU 106.

The CPU 106 outputs a wavelength-variable instruction signal to the control section 105 for instructing the control section 105 to vary the wavelength of emitted light. The CPU 106 also calculates set wavelength of emitted light based on the position data input from the control section 105 and reads a wavelength correction value to correct the light output level based on the set wavelength from the ROM 107, then supplies the wavelength correction value to the LD drive section 108 for causing the LD drive section 108 to correct the quantity of a drive current supplied from the LD drive section 108 to the wavelength-variable light source section 102.

The ROM 107 stores a wavelength calculation processing program which is executed by the CPU 106 and a wavelength correction table setting a number of wavelength correction values for correcting the output level of emitted light in the wavelength-variable light source section 102 corresponding to the position data input from the control section 105 to the CPU 106.

The LD drive section 108 supplies a drive current to the LD in the wavelength-variable light source section 102 based on a light detection signal input from the light detection section 109 for controlling the output level of emitted light to a constant level. The LD drive section 108 also corrects the drive current so as to correct the light detection characteristic responsive to the wavelength in the light detection section 109 in accordance with the wavelength correction value supplied from the CPU 106 and controls the output level of emitted light to a constant level even if the wavelength of the emitted light from the wavelength-variable light source section 102 is varied.

The light detection section 109 is made up of a lens 109a and a light detection element 109b. The lens 109a emits reference light input from the wavelength-variable light source section 102 via an optical fiber 110 to an optical connection terminal 112 to the light detection element 109b as collimated light. The light detection element 109b receives incident light through the lens 109a and converts the light into a light detection signal having a predetermined voltage level in response to the received light strength with the light reception sensitivity characteristic responsive to the wavelength, then outputs the light detection signal from a detection terminal 113 via a cable 114 to the LD drive section 108.

Thus, in the conventional wavelength-variable light source apparatus 101 shown in FIG. 11, the CPU 106 always monitors the move position in the wavelength-variable drive section 103 and corrects the drive current supplied from the LD drive section 108 to the wavelength-variable light source section 102 in response to the wavelength.

However, in the conventional wavelength-variable light source apparatus 101 shown in FIG. 11, the CPU 106 always monitors the move position in the wavelength-variable drive section 103 and corrects the drive current supplied from the LD drive section 108 to the wavelength-variable light source section 102 in response to the wavelength, thus the processing load on the CPU becomes large and installation of the CPU results in an increases in costs of the wavelength-variable light source apparatus.

SUMMARY OF THE INVENTION

It is therefore an object of the invention to provide a wavelength-variable light source apparatus which simplifies wavelength calibration work, thereby providing a wavelength calibration function at low costs.

In order to achieve the above object, according to a first aspect of the invention, there is provided a wavelength-variable light source apparatus comprising: a semiconductor laser light source section; an external resonance section having a reflection surface for externally resonating emitted light from the semiconductor laser light source section at a predetermined reflection wavelength; a drive section for moving a position of the reflection surface in the external resonance section for varying an external resonance condition; a control section for controlling a variable move distance of the reflection surface in the drive section; and a wavelength detection section comprising a gas cell having a wavelength absorption characteristic absorbing light at a plurality of specific wavelengths for sweeping light emitted from the external resonance section into the gas cell and detecting an absorption wavelength of the emitted light, wherein the control section controls the move distance of the reflection surface in the drive section based on the absorption wavelength detected by the wavelength detection section.

Therefore, the control function of moving the wavelength to any desired wavelength while calibrating the current wavelength of emitted light in the wavelength-variable light source apparatus can be added; the need for a large-sized and expensive wave meter and the like for measuring wavelengths can be eliminated and wavelength calibration work can be simplified, thereby providing the wavelength calibration function at low costs. The wavelength detection section can be contained in the wavelength-variable light source apparatus; the wavelength-variable light source apparatus can be made easily portable and the ease-of-use thereof can be improved.

Further, it is another object of the invention to provide a wavelength-variable light source apparatus which provides a function of controlling the output level of emitted light to a constant level in response to a variable wavelength at low costs without using a CPU.

In order to achieve the above object, according to a second aspect of the invention, there is provided a wavelength-variable light source apparatus comprising: a semiconductor laser light source section; an external reso-nance section for externally resonating emitted light from the semiconductor laser light source section at a predetermined wavelength; a drive section for varying an external resonance condition in the external resonance section; a control section for controlling the external resonance condition in the drive section, the control section outputting a control signal for controlling the external resonance condition; a light detection section for detecting a light output level of the emitted light from the semiconductor laser light source section; a light source drive control section for correcting a drive signal supplied to the semiconductor laser light source section based on the light output level detected by the light detection section for controlling the light output level to a constant level; a storage section for storing a wavelength correction value corresponding to the wavelength of the emitted light from the semiconductor laser light source section; and a count section for counting an address for reading the wavelength correction value stored in the storage section based on the control signal output from the control section, wherein the light source drive control section corrects the drive signal supplied to the semiconductor laser light source section based on the wavelength correction value read from the storage section according to the address counted by the count section for controlling the light output level to a constant level.

Therefore, using a counter and a memory such as an ROM, the function of controlling the output level of emitted light to a constant level in response to a variable wavelength can be provided at low costs without using a CPU.

Further, according to a third aspect of the invention, there is provided a wavelength-variable light source apparatus comprising: a semiconductor laser light source section; an external resonance section for externally resonating emitted light from the semiconductor laser light source section at a predetermined wavelength; a drive section for varying an external resonance condition in the external resonance section; a control section for controlling the external resonance condition in the drive section, the control section outputting an analog control signal for controlling the external resonance condition; a light detection section for detecting a light output level of the emitted light from the semiconductor laser light source section; a light source drive control section for correcting a drive signal supplied to the semiconductor laser light source section based on the light output level detected by the light detection section for controlling the light output level to a constant level; a storage section for storing a wavelength correction value corresponding to the wavelength of the emitted light from the semiconductor laser light source section; and an address generation section for converting the analog control signal output from the control section into a digital signal and generates an address for reading the wavelength correction value stored in the storage section, wherein the light source drive control section corrects the drive signal supplied to the semiconductor laser light source section based on -the wavelength correction value read from the storage section according to the address generated by the address generation section for controlling the light output level to a constant level.

Therefore, using an A/D converter and a memory such as an ROM, the function of controlling the output level of emitted light to a constant level in response to a variable wavelength can be provided at low costs without using a CPU.

BRIEF DESCRIPTION OF THE DRAWINGS

In the accompanying drawings:

FIG. 3 is an illustration to show a wavelength absorption characteristic table of acetylene gas sealed in a gas cell in FIG. 1;

FIG. 7 is an illustration to show examples of calculation items indicating a calculation process from the number of pulses to wavelength and that from wavelength to the number of pulses based on expression (4);

DETAILED DESCRIPTION OF THE PREFERRED EMBODIMENTS

FIGS. 1 to 7 show an embodiment of a wavelength-variable light source system incorporating the invention.

First, the configuration will be described.

Figure 1:
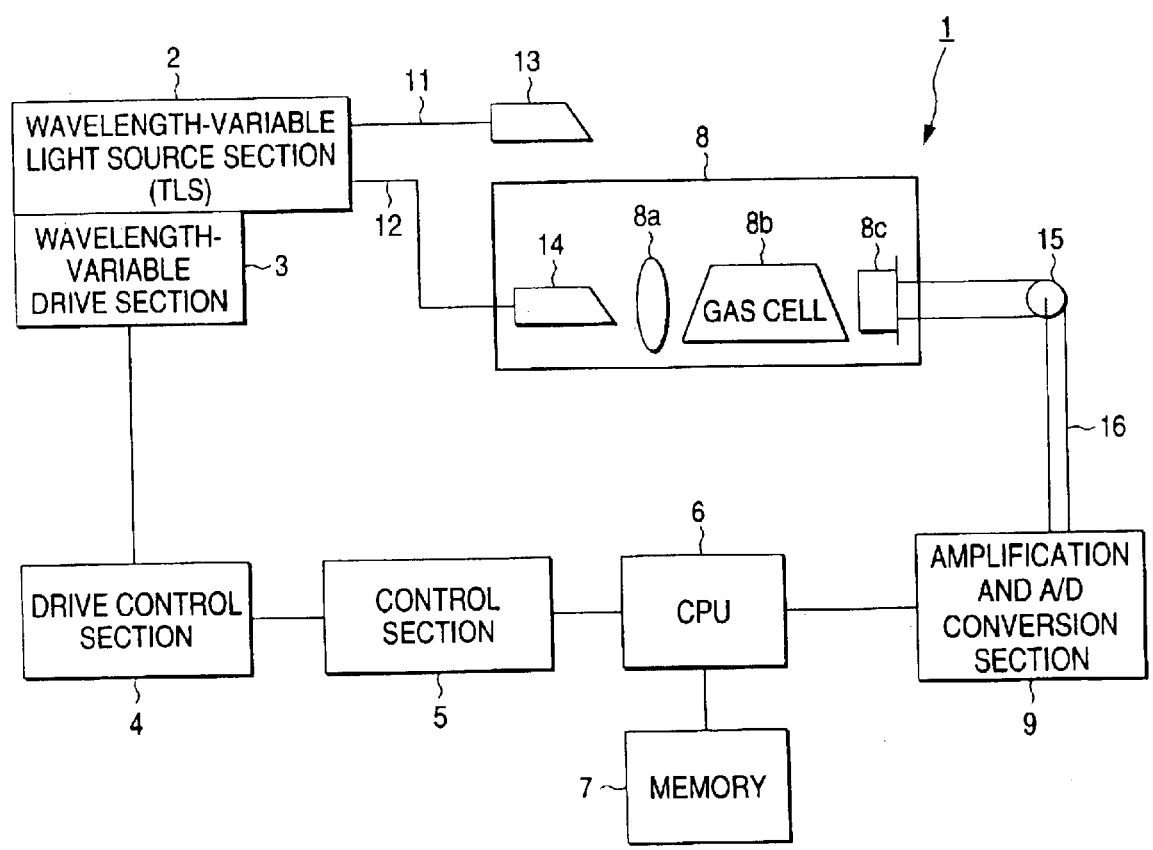
FIG. 1 is a block diagram to show the configuration of a wavelength-variable light source system in an embodiment incorporating the invention.

FIG. 1 is a block diagram to show the configuration of a wavelength-variable light source system 1 in the embodiment of the invention. In the figure, the wavelength-variable light source system 1 comprises a wavelength-variable light source section 2, a wavelength-variable drive section 3, a drive control section 4, a control section 5, a CPU 6, a memory 7, a wavelength detection section 8, and an amplification and A/D conversion section 9. Emitted light from the wavelength-variable light source section 2 is output to the outside as output light by means of an optical fiber 11 and to the wavelength detection section 8 as reference light by means of an optical fiber 12.

Optical connection terminals 13 and 14 for sweeping the output light and reference light into an external optical machine and the wavelength detection section 8 respectively are integrally mounted on the output ends of the optical fibers 11 and 12.

Figure 2:
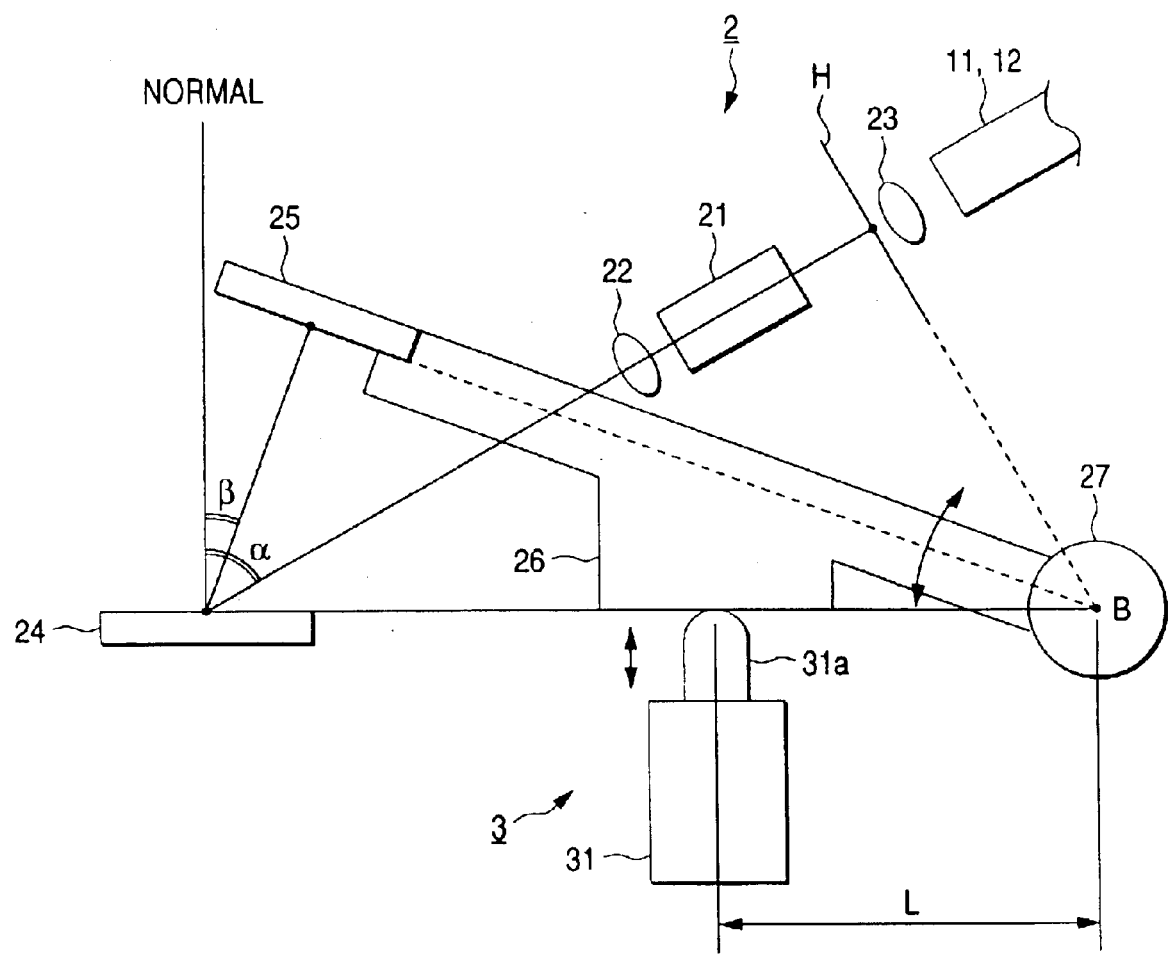
FIG. 2 is a diagram to show the internal configurations of a wavelength-variable light source section and a wavelength-variable drive section in FIG. 1.

FIG. 2 shows the internal configuration of the wavelength-variable light source (TLS) section 2. As shown here, the wavelength-variable light source section 2 comprises an LD 21 which is a light source, a lens 22 for making output light from the LD 21 collimated light, a lens 23 for making reflected light from an imaginary reflection surface H collimated light, a diffraction grating 24 for diffracting the collimated light through the lens 22 in response to the wavelength and reflecting the light on a mirror 25, the mirror 25 for reflecting the diffracted light from the diffraction grating 24, and a mirror move member 26 having one end to which the end of the mirror 25 is fixed and the other end fixed to a rotation shaft 27 for rotating and moving the mirror 25 with the rotation shaft 27 as the center.

Reference numeral 31 in FIG. 2 designates a pulse motor for rotating and moving the mirror move member 26 with the rotation shaft 27 as the center. The pulse motor 31 forms a part of the wavelength-variable drive section 3 in FIG. 1.

The members in the wavelength-variable light source section 2 shown in FIG. 2 are placed so as to prevent mode hopping of wavelength from occurring in output light according to a Littmon technique. Therefore, in the wavelength-variable light source section 2, the output light from the LD 21 is made collimated light through the lens 22 and the collimated light is incident on the diffraction surface of the diffraction grating 24 at an incidence angle $\alpha$ with the normal to the diffraction surface. The diffracted light on the diffraction surface in response to the wavelength is incident on the mirror 25. The diffracted light incident on the reflection surface of the mirror 25 at an angle $\beta$ with the normal to the diffraction surface becomes light vertically incident on the reflection surface of the mirror 25, thus the light vertically reflected on the reflection surface is again incident on the diffraction surface at the incidence angle $\beta$ and is returned to the lens 22 at the angle $\alpha$ with the normal to the diffraction surface.

A part of the diffracted light returned to the lens 22 is reflected on the end face of the LD 21 (imaginary reflection surface H: surface with refractive index of 1) and is returned from the diffraction grating 24 to the reflection surface of the mirror 25 on the same path. Another part of the diffracted light passes through the end face of the LD 21 and is made collimated light through the lens 23 and the collimated light is incident on the optical fibers 11 and 12 and is output as the output light and reference light of a predetermined wavelength $\lambda$ by means of the optical fibers 11 and 12. The light through the lens 23 is incident on the optical fibers 11 and 12 by using an optical turnout such as a beam splitter or a fiber coupler.

Thus, in the wavelength-variable light source section 2, a resonator is formed between the end face of the LD 21 (imaginary reflection surface H) and the end face of the mirror 25 (reflection surface) and a predetermined drive power is applied to the LD 21, whereby light is output from the LD 21 and light of wavelength based on the internal resonance condition is output.

The diffraction grating 24 is formed on the diffraction surface with a diffraction grating (M) of 900 lines/mm, for example. The reflection position of the diffracted light on the mirror 25 (rotation angle of reflection surface, $\beta$) is set corresponding to the rotation angle of the mirror move member 26 having the opposite end fixed to the rotation shaft 27. A rotation shaft 31a of the pulse motor 31 threadably engaging the bottom face of the mirror move member 26 in FIG. 2 rotates and moves up and down in FIG. 2, whereby the rotation angle of the mirror move member 26 is changed.

Therefore, the number of revolutions of the rotation shaft 31a of the pulse motor 31 is controlled, whereby the up and down move distance of the rotation shaft 31*a* is changed continuously and the rotation angle of the mirror move member 26 is changed continuously, whereby the rotation angle β of the reflection surface, which is the reflection position of the diffracted light on the mirror 25, can be changed continuously and the wavelength λ of the diffracted light reflected vertically from the reflection surface and returned to the diffraction grating 24 can be changed linearly.

The number of revolutions of the pulse motor 31 forming a part of the wavelength-variable drive section 3 is controlled by a motor drive control signal input from the drive control section 4 in FIG. 1; the number of revolutions (up and down move distance) is controlled in response to the number of input pulses set in the motor drive control signal. In the embodiment, the relationship between the rotation angle, responsive to one pulse, of the rotation shaft 31*a* of the pulse motor 31 and the up and down move distance has a resolution of 15 nm (nanometers)/pulse per 1-pulse rotation angle, for example.

Next, the drive control section 4 in FIG. 1 generates a motor drive control signal for determining the number of revolutions of the pulse motor 31 in response to a mirror rotation control signal input from the control section 5 and outputs the motor drive control signal to the pulse motor 31 in the wavelength-variable drive section 3.

The wavelength-variable drive section 3 further contains a drive power supply section (not shown) for applying a drive power to the LD 21 in the wavelength-variable light source section 2.

The control section 5 generates a mirror rotation control signal in response to a mirror rotation instruction signal input from the CPU 6 and outputs the mirror rotation control signal to the drive control section 4.

The CPU 6 executes wavelength calibration processing 1 (described later) in accordance with a program for the wavelength calibration processing 1 stored in the memory 7 and sets a reference wavelength λ0 of output light (reference light) output from the wavelength-variable light source section 2. The CPU 6 also executes wavelength calibration processing 2 (described later) in accordance with a program for the wavelength calibration processing 2 stored in the memory 7 and determines constants of an expression indicating the relationship between the wavelength of output light (reference light) output from the wavelength-variable light source section 2 and the number of pulses in the pulse motor 31.

That is, to execute the wavelength calibration processing 1 and the wavelength calibration processing 2, the CPU 6 outputs a mirror rotation instruction signal to the control section 5, causes the control section 5 and the drive control section 4 to control rotation of the pulse motor 31 in the wavelength-variable drive section 3, monitors the number of pulses indicating the move distance of the rotation shaft 31*a* in the pulse motor 31 and a digital light detection signal input from the amplification and A/D conversion section 9, makes reference to an absorption wavelength characteristic table of a gas cell 8*b* stored in the memory 7, detects the wavelength λ of reference light emitted from the wavelength-variable light source section 2 to the wavelength detection section 8, and calculates a wavelength interval using an expression stored in the memory 7 with the monitored number of pulses and the detected wavelength λ as some of parameters, thereby setting the reference wavelength λ0 of output light output from the wavelength-variable light source section 2 and determining the constants of the expression indicating the relationship between the wavelength of output light (reference light) and the number of pulses (rotation angle) in the pulse motor 31. The CPU 6 makes it possible to prepare a table plotting the relationship between the number of pulses indicating the rotation move distance in the pulse motor 31 and the wavelength of light output from the wavelength-variable light source section 2, provided by executing the wavelength calibration processing 1 and the wavelength calibration processing 2.

The memory 7 is made of a flash ROM (read-only memory), an EEPROM (electrically erasable and programmable read-only memory), or the like, and stores the programs for the wavelength calibration processing 1 and 2 and the expressions used with the wavelength calibration processing 1 and 2 and the parameters (constants, variables, and the like) applied to the expressions. The memory 7 also stores a wavelength absorption characteristic table of acetylene gas sealed in the gas cell 8*b* contained in the wavelength detection section 8 (see FIG. 3).

The wavelength detection section 8 consists of a lens 8*a*, the gas cell 8*b*, and a light detection element 8*c*, as shown in FIG. 1. Through the lens 8*a*, reference light input from the wavelength-variable light source section 2 via the optical fiber 12 to the optical connection terminal 14 is made collimated light and the collimated light is emitted to the incident end face of the gas cell 8*b*.

For example, acetylene gas is sealed in a glass case of the gas cell 8*b* as gas for absorbing light wavelength λ at predetermined intervals. The acetylene gas type is 12 acetylene or 13 acetylene which is an isotope of 12 acetylene. FIG. 3 shows wavelength absorption characteristic tables of 12 acetylene and 13 acetylene. Each of the wavelength absorption characteristic tables consists of a "LINE" section storing the line names P21, P20, . . . , R2, R3, . . . , R10, . . . R18 defining the wavelength absorption positions of acetylene, a "Frequency (MHz)" section storing the frequency of the wavelength λ for each line name, and a "WAVELENGTH (nm)" section storing the wavelength value obtained by converting the frequency for each line into wavelength λ. As shown in FIG. 3, 12 acetylene contains 36 wavelength absorption lines and 13 acetylene contains 54 wavelength absorption lines.

The gas cell 8*b* absorbs a predetermined number of lines of the wavelength λ of light incident through the lens 8*a* at predetermined intervals according to the wavelength absorption characteristic of the sealed-in acetylene gas and allows light other than the absorption wavelength to pass through to the light detection element 8*c*. The incident end face and emission end face of the gas cell 8*b* are formed as slopes so as to avoid interference of light.

The light detection element 8*c* receives the light passing through the gas cell 8*b*, converts the light into a light detection signal having a predetermined voltage level in response to the light strength of the light received with the light reception sensitivity responsive to the wavelength, then outputs the light detection signal from a detection terminal 15 via a cable 16 to the amplification and A/D conversion section 9.

The amplification and A/D conversion section 9 amplifies the light detection signal input from the light detection element 8*c* and converts the amplified signal into a digital light detection signal responsive to the voltage level of the light detection signal, then outputs the digital light detection signal to the CPU 6.

Next, the operation of the embodiment will be described.

Figure 4:
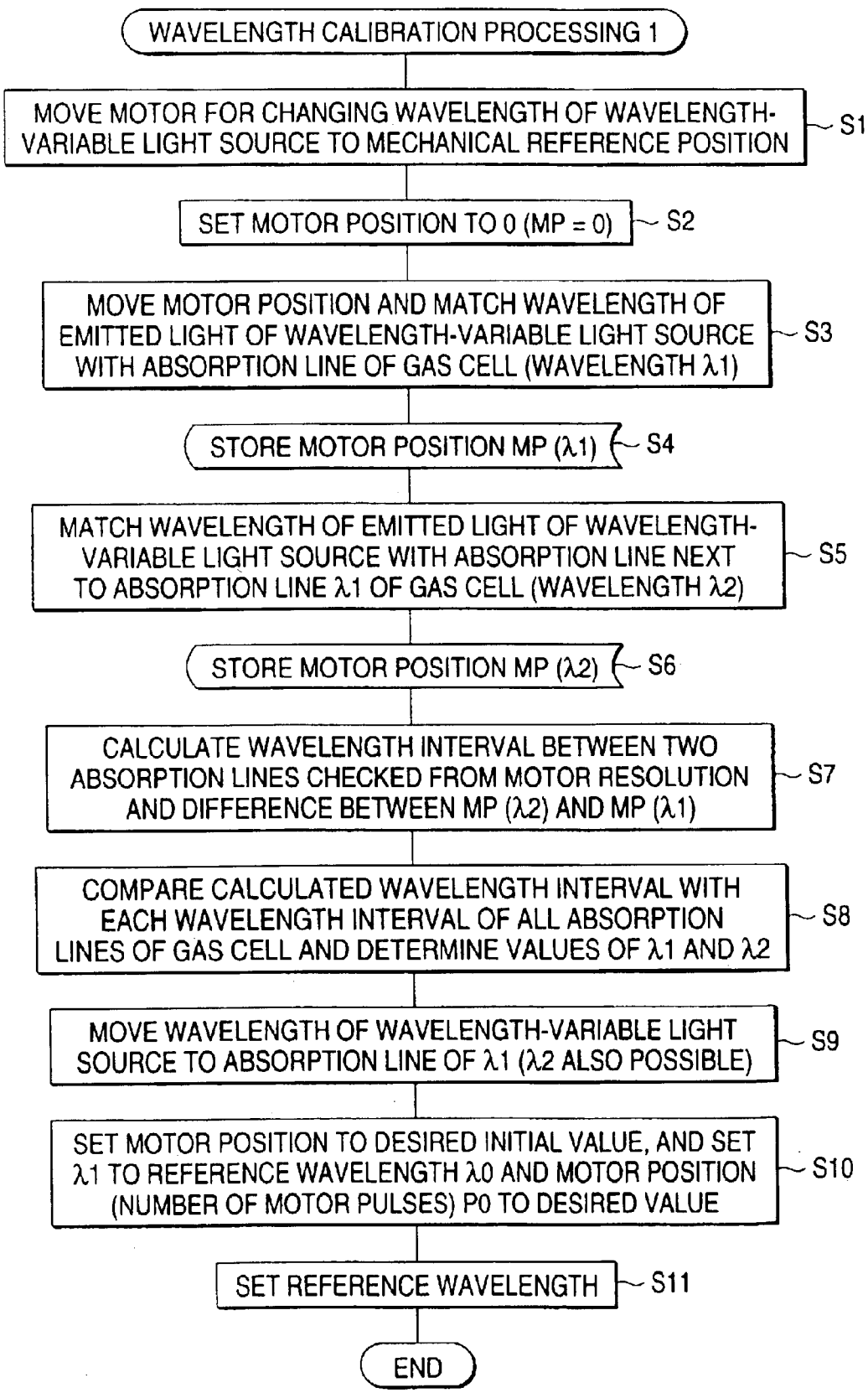
FIG. 4 is a flowchart to show wavelength calibration processing 1 executed by a CPU in FIG. 1.

First, the wavelength calibration processing 1 which is executed by the CPU 6 will be described with reference to a flowchart shown in FIG. 4.

The CPU 6 outputs a mirror rotation instruction signal to the control section 5 so as to move the pulse motor 31 in the wavelength-variable drive section 3 to a mechanical reference position at step S1, causes the control section 5 to generate a mirror rotation control signal and output the signal to the drive control section 4, and causes the drive control section 4 to generate a motor drive control signal and output the signal to the pulse motor 31 in the wavelength-variable drive section 3 for moving the rotation position of the pulse motor 31 to the mechanical reference position. When the pulse motor 31 is moved to the mechanical reference position, the CPU 6 sets a parameter MP for managing the rotation position of the pulse motor 31 to 0 and stores MP=0 in the memory 7 at step S2.

Next, the CPU 6 further outputs a mirror rotation instruction signal to the control section 5 so as to move the pulse motor 31 from the mechanical reference position, causes the control section 5 to generate a mirror rotation control signal and output the signal to the drive control section 4, and causes the drive control section 4 to generate a motor drive control signal and output the signal to the pulse motor 31 for moving the rotation position of the pulse motor 31 from the mechanical reference position for matching the wavelength of reference light emitted from the wavelength-variable light source section 2 to the wavelength detection section 8 with any absorption line (line shown in FIG. 3) of the gas cell 8b at step S3.

That is, in the wavelength-variable light source section 2 previously described with reference to FIG. 2, the rotation shaft 31a of the pulse motor 31 is rotated in response to the number of input pulses from the mechanical reference position (position with number of revolutions=0) in accordance with the pulse signal set in the motor drive control signal input from the drive control section 4 and starts to move upward (15 nm/pulse). At the time, the bottom face of the mirror move member 26 threadably engaging the rotation shaft 31a is pressed and the rotation shaft 27 to which the mirror move member 26 is fixed is rotated, then the position of the mirror 25 fixed to the mirror move member 26 is moved upward.

With the rotation move of the mirror 25, the rotation angle β of the reflection surface of the mirror 25 with the diffracted light from the diffraction grating 24 is changed continuously and the wavelength λ of the diffracted light reflected vertically from the reflection surface and returned to the diffraction grating 24 at the angle β is varied linearly for linearly varying the wavelength λ of the reference light emitted to the wavelength detection section 8.

At this time, in the wavelength detection section 8, the wavelength λ of the reference light incident on the gas cell 8b through the lens 8a from the optical fiber 12 is varied linearly, and the reference light of the wavelength λ matching the absorption line (wavelength) is absorbed according to the wavelength absorption characteristic of the acetylene gas sealed in the gas cell 8b shown in FIG. 3. Thus, of the light passing through the gas cell 8b and incident on the light detection element 8c, the light detection level (voltage level) of the reference light of the wavelength λ matching any absorption line (wavelength) lowers as compared with the case where the wavelength does not match the absorption line.

Thus, the CPU 6 checks a valley between the light detection levels according to a digital light detection signal input from the amplification and A/D conversion section 9, thereby detecting the fact that the wavelength λ of the reference light emitted from the wavelength-variable light source section 2 becomes the first wavelength λ which is the same as the absorption line in the gas cell 8b. At this time, the CPU 6 sets the first wavelength λ which becomes the same as the absorption line to λ1, relates it to the number of pulses of the pulse motor 31 monitored, and stores MP (λ1) as a parameter indicating that the wavelength is the absorption wavelength corresponding to the motor position MP in the memory 7 at step S4.

Next, the CPU further outputs a mirror rotation instruction signal to the control section 5 so as to further move the pulse motor 31, causes the control section 5 to generate a mirror rotation control signal and output the signal to the drive control section 4, and causes the drive control section 4 to generate a motor drive control signal and output the signal to the pulse motor 31 for further moving the rotation position of the pulse motor 31 from the motor position stored at step S4 for matching the wavelength of the reference light emitted from the wavelength-variable light source section 2 to the wavelength detection section 8 with the next near absorption line of the gas cell 8b from the wavelength λ1 stored at step S4 at step S5.

At this time, in the wavelength detection section 8, the wavelength λ of the reference light incident on the gas cell 8b through the lens 8a from the optical fiber 12 is varied linearly, and the reference light of the wavelength λ matching the next near absorption line (wavelength) to the first wavelength λ1 is absorbed according to the wavelength absorption characteristic of the acetylene gas sealed in the gas cell 8b shown in FIG. 3. The light detection level (voltage level) of the reference light lowers as compared with the case where the wavelength does not match the absorption line. Thus, the CPU 6 checks a valley between the light detection levels according to a digital light detection signal input from the amplification and A/D conversion section 9, thereby detecting the fact that the wavelength λ of the reference light emitted from the wavelength-variable light source section 2 becomes another wavelength λ which is the same as the next absorption line in the gas cell 8b. At this time, the CPU 6 sets the wavelength λ which becomes the same as the absorption line to λ2, relates it to the number of pulses of the pulse motor 31 monitored, and stores MP (λ2) as a parameter indicating that the wavelength is the absorption wavelength corresponding to the motor position MP in the memory 7 at step S6.

Next, to find the wavelength interval between the two absorption wavelengths λ1 and λ2 checked from the resolution of the pulse motor 31 (15 nm/pulse) and the difference between the parameters MP (λ1) and MP (λ2) indicating the absorption wavelengths corresponding to the motor positions MP stored in the memory 7 from the relationship with the motor move distances in the absorption wavelengths λ1 and λ2, the CPU 6 calculates the motor move distances in the absorption wavelengths λ1 and λ2 according to the following expression (1) at step S7:

$$\Delta = P * d \tag{1}$$

where Δ is the motor move distance, P is the number of pulses, and d is the unit move distance of motor.

The CPU 6 finds the wavelength interval (nm) from the difference between the motor move distances Δ1 and Δ2 in the absorption wavelengths λ1 and λ2 found according to the expression (1) at step S7, compares the found wavelength interval with each wavelength value interval (nm) of all absorption lines in the wavelength absorption characteristic table (FIG. 3) of acetylene gas sealed in the gas cell 8b, and determines the wavelength values of the absorption wavelengths λ1 and λ2 matched with the absorption lines in the present wavelength calibration processing 1 at step S8. The CPU 6 again outputs a mirror rotation instruction signal for moving the motor position MP to the control section 5 so as to match the wavelength λ of light output from the wavelength-variable light source section 2 with the absorption line position corresponding to the determined absorption wavelength value λ1 or λ2 at step S9.

That is, the CPU 6 causes the control section 5 to generate a mirror rotation control signal and output the signal to the drive control section 4 based on the parameter MP (λ1) or MP (λ2) stored in the memory 7 and causes the drive control section 4 to generate a motor drive control signal and output the signal to the pulse motor 31 for moving the rotation position of the pulse motor 31 for matching the wavelength λ of the reference light emitted from the wavelength-variable light source section 2 to the wavelength detection section 8 with the absorption wavelength λ1 or λ2.

Next, to set the motor position MP (number of pulses) corresponding to the absorption wavelength λ1 or λ2 matched at step S9 to an initial value, the CPU 6 sets the matched wavelength λ1 or λ2 to a reference wavelength λ0, sets the initial value of the motor position (number of pulses) in a motor reference position P0 to 0, for example, and calculates an emission angle β of diffracted light to the mirror 25 from the diffraction grating 24 in the wavelength-variable light source section 2 placed in a state outputting light of the reference wavelength λ0 according to the following expression (3) based on the following expression (2) at step S10:

$$\sin(\alpha) + \sin(\beta 0) = n*M*\lambda 0 \quad (2)$$

$$\beta 0 = A \sin((n*M*\lambda 0) - \sin(\alpha)) \quad (3)$$

where n: Diffraction degree of the diffraction grating 24;

M: Number of diffraction grating groove lines of the diffraction grating 24;

λ0: Reference wavelength;

α: Incidence angle of light emitted from the LD 21 to the diffraction grating 24; and β0: Emission angle of diffracted light to the mirror 25 from the diffraction grating 24 at λ0.

The CPU 6 sets the initial value of the number of pulses of the reference wavelength λ0 set in the memory 7 at step S10 (λ0=1.455E−06 (m)), the number of pulses (P0=0), the emission angle β0 (DEG) of diffracted light to the mirror 25 from the diffraction grating 24, and the like, in the memory 7 at step S11, and terminates the wavelength calibration processing 1.

By executing the wavelength calibration processing 1, the wavelength-variable light source system 1 completes checking the reference wavelength λ0 of the current output light from the wavelength-variable light source section 2. Next, the wavelength calibration processing 2 which is executed by the CPU 6 will be described with reference to a flowchart shown in FIG. 5.

In the wavelength calibration processing 2, constants of expression (4) indicating the relationship between the wavelength of output light (reference light) output from the wavelength-variable light source section 2 and the number of pulses in the pulse motor 31 are determined. The expression (4) and expressions (3) and (5) related thereto are as follows:

$$A \sin((n*M*\lambda 0) - \sin(\alpha)) = \beta 0 + A \tan(P*d/L) \quad (4)$$

The expression on the left-hand side of the expression (4) is the above-mentioned expression (3) indicating the relationship between the incidence angle α, β of light in the diffraction grating and the wavelength λ of the light. The expression on the right-hand side of the expression (4) is the following expression (5) indicating the relationship between the incidence angle β of light in the diffraction grating and the motor move distance:

$$\beta = \beta 0 + A \tan(P*d/L) \quad (5)$$

The parameters in the expressions (3) to (5) are defined as follows (the parameters previously described are also contained):

β0, λ0, and P0 are the initial values found in the wavelength calibration processing 1.

β0: Emission angle of diffracted light to the mirror 25 from the diffraction grating 24 at reference wavelength (for example, β0=0.32492 (RAD), 18.61648 (DEG));

λ0: Reference wavelength (for example, λ0=1.455E−06 (m)); and

P0: Number of pulses of the pulse motor 31 at reference wavelength (motor position MP) (for example, P0=0).

α, M, n, L, and d are the constants to be determined in the wavelength calibration processing 2.

α: Incidence angle of light emitted from the LD 21 to the diffraction grating 24 (for example, α=1.431 (RAD), 82.00 (DEG));

M: Number of diffraction grating groove lines of the diffraction grating 24 (for example, 900000 lines/m);

n: Diffraction degree of the diffraction grating 24 (for example, n=1); and

L: Distance between rotation center of the pulse motor 31 and that of the mirror 25 (see FIG. 2) (for example, L=5.00E−02).

Further, λ and P are variables related to output light (reference light) from the wavelength-variable light source section 2.

λ: Wavelength of output light (reference light) from the wavelength-variable light source section 2; and P: Number of pulses in the pulse motor 31.

Figure 5:
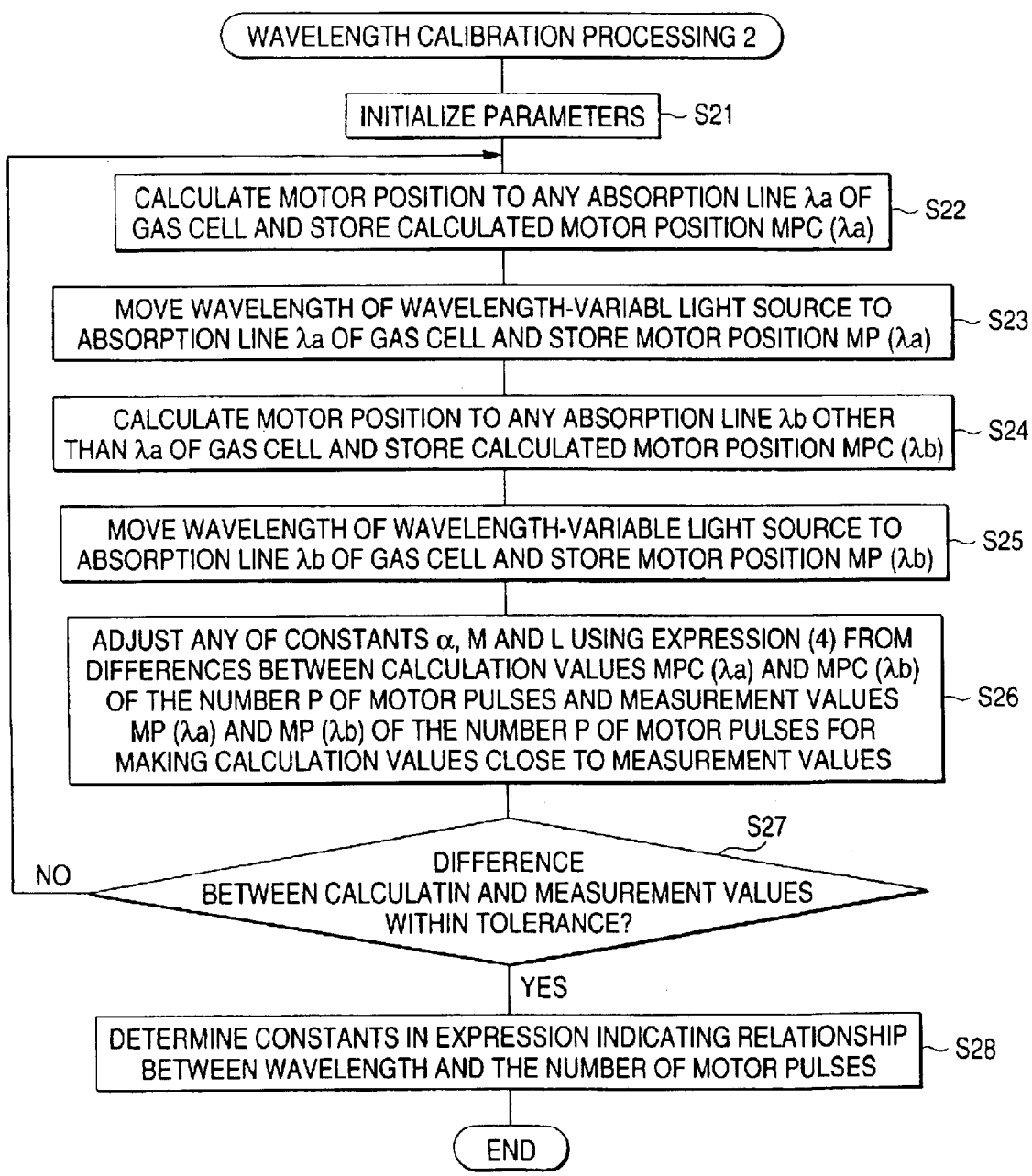
FIG. 5 is a flowchart to show wavelength calibration processing 2 executed by the CPU in FIG. 1.

In the wavelength calibration processing 2 shown in FIG. 5, first the CPU 6 sets the initial values β0 (0.32492 (RAD), 18.61648 (DEG)), λ0 (1.455E−06 (m)), and P0(0) set in the memory 7 by executing the wavelength calibration processing 1 in the expression (4) at step S21. Next, to move the pulse motor 31 so as to match the wavelength of light emitted from the wavelength-variable light source section 2 with any absorption wavelength λa of the gas cell 8b from the absorption wavelength λ1 or λ2 matched in the wavelength calibration processing 1, the CPU 6 determines the motor move distance Δ based on the absorption wavelength values of all lines of the acetylene gas set in the absorption wavelength characteristic table in FIG. 3 and calculates the number of pulses to move the pulse motor from the relationship between the determined motor move distance Δ and the expression (1) according to the following expression (6), then stores the found number of pulses in the memory 7 at step S22:

$$P = \Delta/d \quad (6)$$

where d is the unit move distance of the motor: 15 nm/pulse)

That is, the CPU 6 finds the motor move distance Δ corresponding to the wavelength difference to any absorption wavelength value λa moved from the absorption wavelength λ1 or λ2, for example, the wavelength corresponding to the minimum wavelength in the wavelength variable range of light emitted from the wavelength-variable light source section 2 based on the absorption wavelength values of all lines of the acetylene gas set in the absorption wavelength characteristic table in FIG. 3 and substitutes the motor move distance Δ and the known value d for the expression (6) to calculate the calculation value MPC (λa) of the number of motor pulses to move the pulse motor, then stores the calculation value MPC (λa) of the number of motor pulses in the memory 7.

Next, the CPU 6 outputs a mirror rotation instruction signal to the control section 5 to move the pulse motor 31 so as to match the wavelength of light emitted from the wavelength-variable light source section 2 with the absorption wavelength value λa of the gas cell 8b, causes the control section 5 to generate a mirror rotation control signal and output the signal to the drive control section 4, and causes the drive control section 4 to generate a motor drive control signal and output the signal to the pulse motor 31 for rotating and moving the pulse motor 31 for matching the wavelength of the reference light emitted from the wavelength-variable light source section 2 to the wavelength detection section 8 with the absorption wavelength λa of the gas cell 8b, then stores the number of motor pulses indicating the move distance of the pulse motor 31 at this time in the memory 7 as MP (λa) at step S23.

Next, the CPU 6 finds the motor move distance Δ corresponding to the wavelength difference to any absorption wavelength value λb other than the absorption wavelength value λa of the gas cell 8b, for example, the wavelength corresponding to the maximum wavelength in the wavelength variable range of light emitted from the wavelength-variable light source section 2 and substitutes the motor move distance Δ and the known value d for the expression (6) to calculate the calculation value MPC (λb) of the number of motor pulses to move the pulse motor, then stores the calculation value MPC (λb) of the number of motor pulses in the memory 7 at step S24.

Next, the CPU 6 further outputs a mirror rotation instruction signal to the control section 5 to move the pulse motor 31 so as to match the wavelength of light emitted from the wavelength-variable light source section 2 with the absorption wavelength value λb of the gas cell 8b, causes the control section 5 to generate a mirror rotation control signal and output the signal to the drive control section 4, and causes the drive control section 4 to generate a motor drive control signal and output the signal to the pulse motor 31 for rotating and moving the pulse motor 31 for matching the wavelength of the reference light emitted from the wavelength-variable light source section 2 to the wavelength detection section 8 with the absorption wavelength λb of the gas cell 8b, then stores the number of motor pulses indicating the move distance of the pulse motor 31 at this time in the memory 7 as MP (λb) at step S25.

The CPU 6 adjusts and calculates any of the constants defined at step S21, the incidence angle α, the number M of diffraction grating groove lines, and the distance L between the rotation center of the pulse motor and that of the mirror, using the expression (4) from the differences between the calculation values MPC (λa) and MPC (λb) of the number of motor pulses stored in the memory 7 at steps S22 and S24 and the measurement values MP (λa) and MP (λb) of the number of motor pulses stored in the memory 7 at steps S23 and S25 for making the calculation values MPC (λa) and MPC (λb) based on the expression (6) close to the measurement values MP (λa) and MP (λb) respectively at step S26.

That is, assuming that the diffraction degree n (n=1) and the unit move distance d of the motor (d=15 nm/pulse), of the constants defined at step S21 are fixed and other constants α, M, and L can be adjusted, any one of the constants α, M, and L is adjusted and calculated in the expression (4) for making the calculation values MPC (λa) and MPC (λb) based on the expression (6) close to the measurement values MP (λa) and MP (λb) respectively.

Next, the CPU 6 determines whether each of the difference between the calculation value MPC (λa) and the measurement value MP (λa) and the difference between the calculation value MPC (λb) and the measurement value MP (λb) is within a tolerance at step S27. If the difference is out of the tolerance, the CPU 6 returns to step S22 and repeats the process loop of steps S22 to S26 for placing the difference between the calculation value MPC (λa), MPC (λb) and the measurement value MP (λa), MP (λb) within the tolerance.

When the CPU 6 checks that the difference between the calculation value MPC (λa) and the measurement value MP (λa) and the difference between MPC (λb) and MP (λb) are within the tolerance, the CPU 6 determines the constants α, M, n, L, and d in the expression (4) indicating the relationship between the wavelength of the output light (reference light) output from the wavelength-variable light source section 2 and the number of pulses indicating the move distance in the pulse motor 31 at step S28 and terminates the wavelength calibration processing 2.

In the wavelength calibration processing 2, the CPU 6 has determined the constants α, M, n, L, and d in the expression (4) indicating the relationship between the wavelength of the output light (reference light) emitted from the wavelength-variable light source section 2 and the number of pulses indicating the move distance in the pulse motor 31. Then, the CPU 6 can monitor the number of pulses of the pulse motor 31 and calculate the wavelength value λ according to the expression (4), thereby finding the calculated wavelength value λ and the absorption wavelength value λ of the reference light detected from the wavelength detection section 8 within the tolerance.

Figure 6:
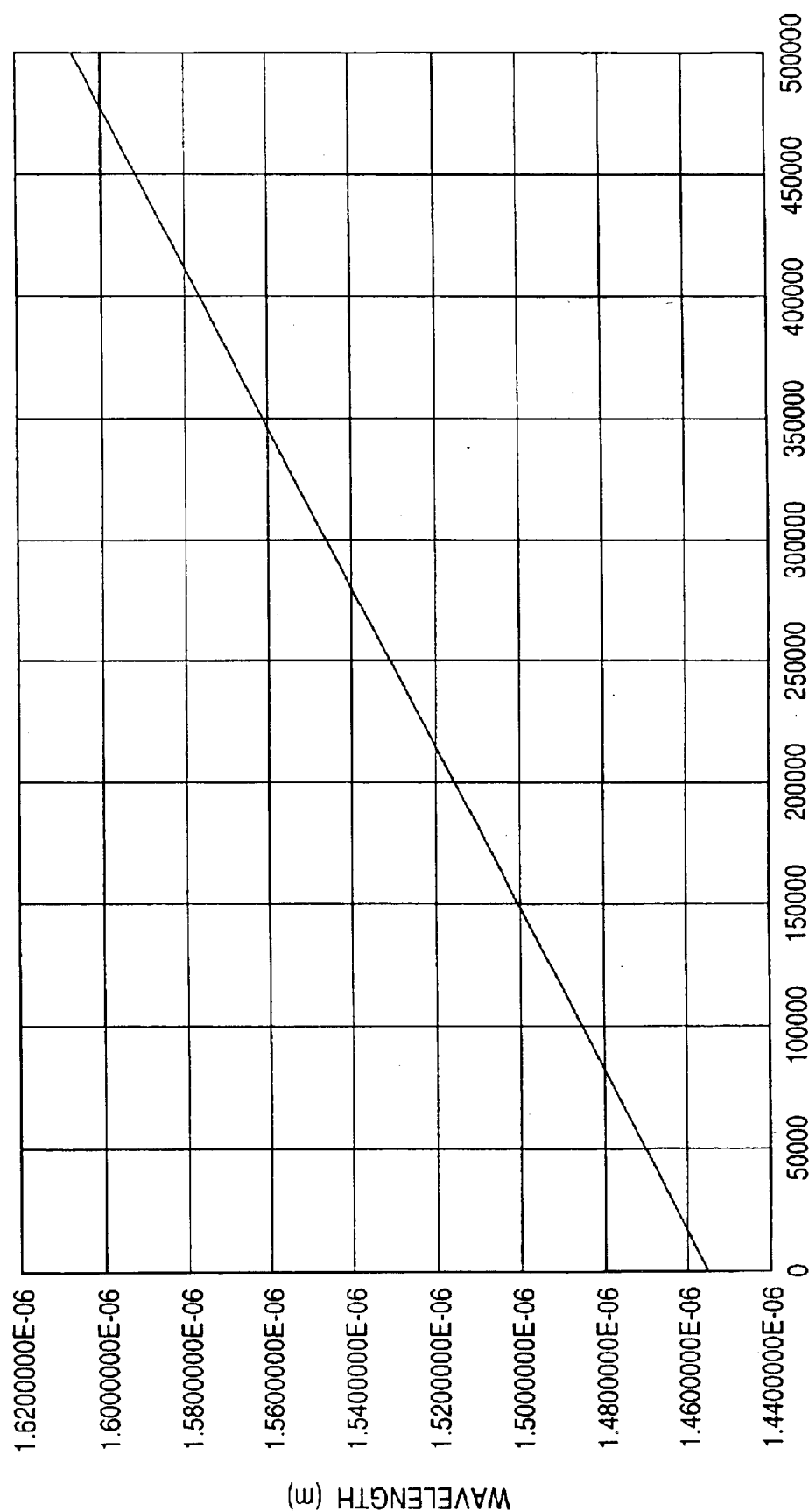
FIG. 6 is an illustration to show an example of a table plotting the relationship between wavelength and the number of motor pulses according to expression (4) with constants determined by executing the wavelength calibration processing 2 in FIG. 5.

The constants α, M, n, L, and d in the expression (4) have been determined, whereby when the relationship between the wavelength and the number of motor pulses is plotted on a table with the wavelength (m) on the vertical axis and the number of motor pulses on the horizontal axis shown in FIG. 6 based on the expression (4), the relationship is determined. Therefore, the CPU 6 can substitute the number of pulses of the pulse motor 31 monitored at any time for the expression (4) for calculation, thereby finding the absorption wavelength value λ emitted from the wavelength-variable light source section 2 in real time, and need not have the table shown in FIG. 6.

Thus, the wavelength-variable light source system 1 in the embodiment contains the wavelength detection section 8 comprising the gas cell 8b for detecting the wavelength of light emitted from the wavelength-variable light source section 2 and has the function of executing the wavelength calibration processing 1 and the wavelength calibration processing 2 by the CPU 6, whereby the wavelength calibration function of calibrating the wavelength of light emitted from the wavelength-variable light source section 2 in real time can be added at low costs and the time and labor required for the wavelength calibration work can be saved drastically. The wavelength-variable light source system 1 in the embodiment eliminates the need for providing a large-sized and expensive wave meter; it can be made easily portable and the ease-of-use of the wavelength-variable light source system 1 can be improved.

The wavelength-variable light source system 1 in the embodiment can use the expression (4) to find the correspondence between the wavelength of the output light from the wavelength-variable light source section 2 and the number of pulses of the pulse motor 31, as described above. Examples indicating a calculation process from the number of pulses to the wavelength and that from the wavelength to the number of pulses based on expression (4) are listed for each calculation item in FIG. 7.

As the calculation direction is shown in FIG. 7, first when the leftmost item "NUMBER OF PULSES" is given, the next item "MOTOR MOVE DISTANCE Δ (m)" is calculated according to the expression (1) and the next item "ANGLE β (RAD)" is calculated according to the expression (5) from the motor move distance Δ, then the next item "WAVELENGTH λ (m)" is calculated according to the expression (7) derived from the expression (2) from the angle β.

$$\lambda = (\sin(\alpha) + \sin(\beta))/(n*M) \quad (7)$$

Thus, when the number of pulses is given, the motor move distance Δ, the angle β, and the wavelength λ can be calculated in order according to the expressions.

Next, in FIG. 7, the next item "ANGLE β (RAD)" is calculated according to the expression (3) from the wavelength λ found according to the expression (7) and the next item "MOTOR MOVE DISTANCE Δ (m)" is calculated according to the expression (8) derived from the expression (5) from the angle β.

$$\Delta = (\tan(\beta - \beta 0))*L \quad (8)$$

The next item "NUMBER OF PULSES" is calculated according to the expression (6) from the motor move distance Δ. Therefore, when the wavelength λ is found by the calculation, the wavelength λ, the angle β, the motor move distance Δ, and the number of pulses can be calculated in order according to the expressions.

In the embodiment, the numeric values and the like of the parameters set in the expressions can be changed in the scope not changing the placement of the components of the wavelength-variable light source section 2 shown in FIG. 2, and the wavelength calibration processing 1 and the wavelength calibration processing 2 can be applied, needless to say. Further, in the embodiment, for wavelength-variable light sources of other configurations as well as the wavelength-variable light source section 2 shown in FIG. 2, the operation contents of the expressions are changed whenever necessary according to parameters considering the placement of components, whereby the wavelength calibration processing 1 and the wavelength calibration processing 2 can be applied. Furthermore, in the embodiment, the pulse motor 31 is used, but any other type of motor can be used if the move distance of the motor can be monitored.

Moreover, in the embodiment, in the wavelength calibration processing 2 which is executed by the CPU 6, the constants α, M, n, L, and d in the expression (4) indicating the relationship between the wavelength of the output light (reference light) emitted from the wavelength-variable light source section 2 and the number of pulses indicating the move distance in the pulse motor 31 can be determined and the calculated wavelength value λ and the absorption wavelength value λ of the reference light detected from the wavelength detection section 8 can be found within the tolerance. Thus, the wavelength value of emitted light can be calculated with accuracy from the number of pulses of the pulse motor 31, the number of pulses can be calculated with accuracy from the absorption wavelength detected by the wavelength detection section 8, and the correspondence between the wavelength of emitted light and the number of pulses of the pulse motor 31 can be found with accuracy. Resultantly, the accuracy of the wavelength calibration processing function of the wavelength-variable light source system 1 can be enhanced.

According to the wavelength-variable light source apparatus of the invention, the control function of moving the wavelength to any desired wavelength while calibrating the current wave length of emitted light in the wavelength-variable light source apparatus can be added; the need for a large-sized and expensive wave meter or the like for measuring wavelengths can be eliminated and wavelength calibration work can be simplified, thereby providing the wavelength calibration function at low costs. The wavelength detection section can be contained in the wavelength-variable light source apparatus; the wavelength-variable light source apparatus can be made easily portable and the ease-of-use thereof can be improved.

Figure 8:
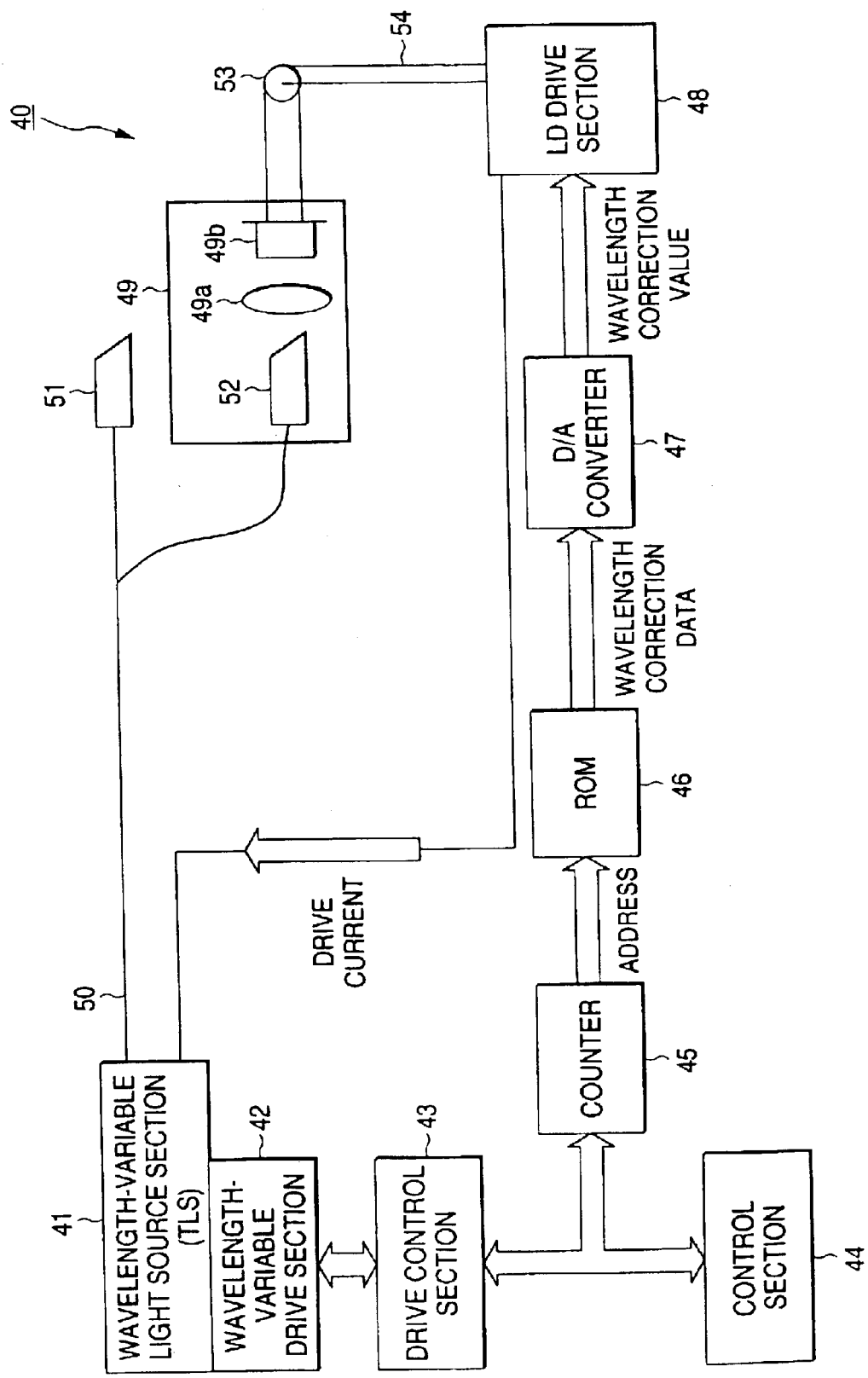
FIG. 8 is a block diagram to show the configuration of a control system in a wavelength-variable light source apparatus in another embodiment incorporating the invention.
Figure 9:
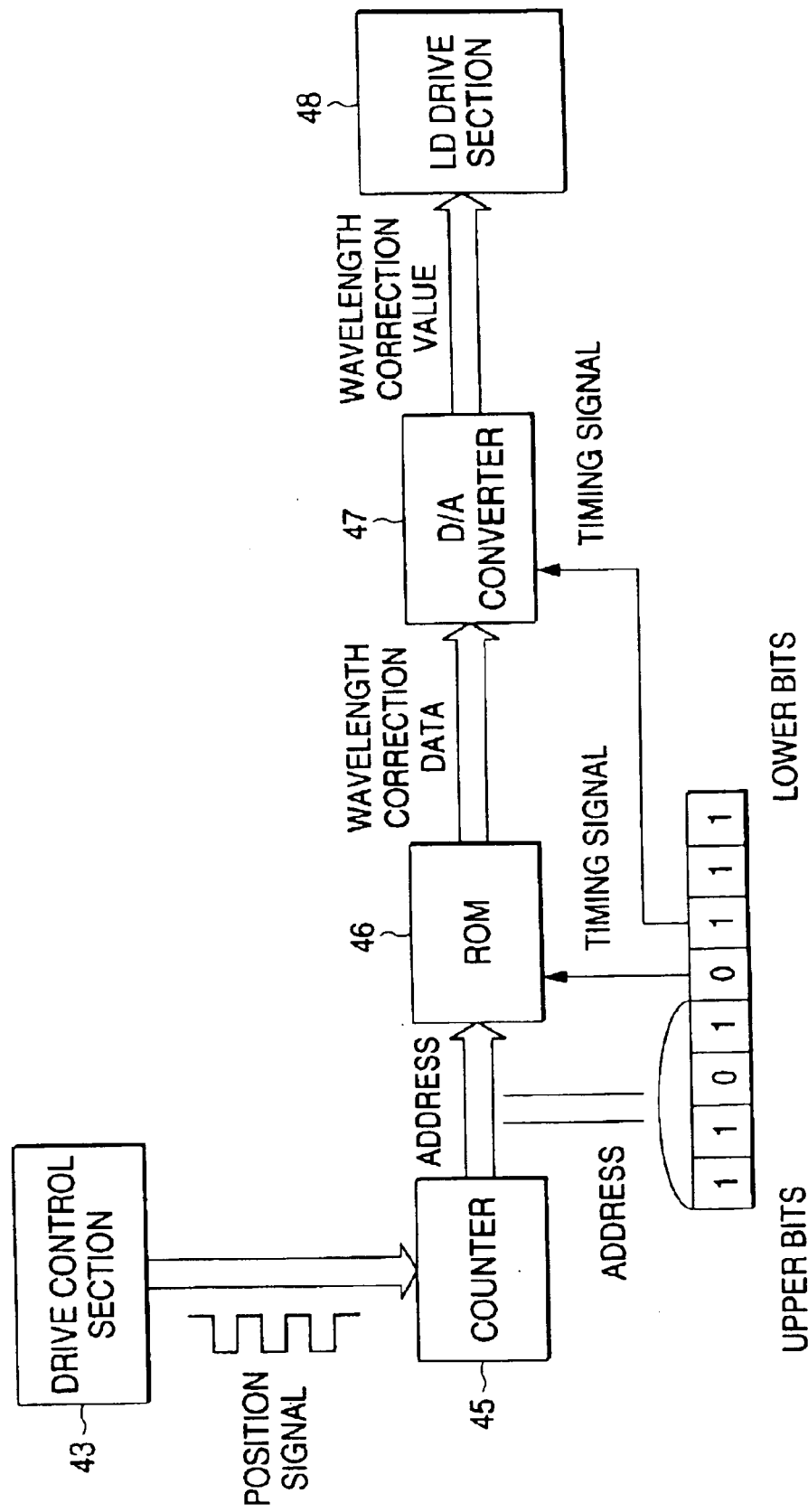
FIG. 9 is a diagram to show a signal flow among the blocks of a drive control section, a counter, an ROM, a D/A converter, and an LD drive section in FIG. 8.

FIGS. 8 and 9 show another embodiment of a wavelength-variable light source apparatus incorporating the invention.

First, the configuration will be described.

FIG. 8 is a block diagram to show the configuration of a wavelength-variable light source apparatus 40 in the embodiment. In the figure, the wavelength-variable light source apparatus 40 comprises a wavelength-variable light source section 41, a wavelength-variable drive section 42, a drive control section 43, a control section 44, a counter 45, an ROM 46, a D/A converter 47, an LD drive section 48, and a light detection section 49.

The wavelength-variable light source section (TLS) 41 uses an LD of an external resonator type (not shown). The mechanical position of an optical filter (not shown) forming a part of an external resonator is moved by the wavelength-variable drive section 42, whereby the external resonance condition is varied and the wavelength of emitted light can be made variable in a wide range (minimum wavelength λ0 to maximum wavelength λMAX) Emitted light from the wavelength-variable light source section 41 is emitted to the outside as output light and to the light detection section 49 as reference light by means of a branched optical fiber 50.

Optical connection terminals 51 and 52 for sweeping the output light and reference light into an external optical machine and the light detection section 49 respectively are integrally mounted on the output ends of the branched optical fiber 50, and the optical connection terminal 52 is connected to the light detection section 49.

The wavelength-variable drive section 42, which is made up of a pulse motor and the like, turns and moves the pulse motor in response to a drive control signal input from the drive control section 43, thereby moving the mechanical position of the optical filter in the wavelength-variable light source section 41 and outputs a rotary encode signal indicating the move position of the pulse motor to the drive control section 43 as a position signal (digital signal).

The drive control section 43 generates a drive control signal in response to a wavelength-variable control signal input from the control section 44 and outputs the drive control signal to the wavelength-variable drive section 42 for turning and moving the pulse motor and also outputs the position signal (rotary encode signal) input from the wavelength-variable drive section 42 to the control section 44 and the counter 45.

The control section 44 has a function of controlling the relationship between the move position of the optical filter in the wavelength-variable light source section 41 and the wavelength λ of emitted light. The control section 44 outputs a wavelength-variable control signal for setting the move position corresponding to the wavelength $\lambda$ to the drive control section 43 for setting the wavelength $\lambda$ of emitted light. The control section 44 also checks that the emitted light is set to the setup wavelength $\lambda$ based on the position signal (rotary encode signal) input from the drive control section 43, then causes the drive control section 43 to stop the drive control.

The counter 45 counts an address in a wavelength correction table storing wavelength correction data in the ROM 46 based on the position signal (rotary encode signal) input from the drive control section 43 and outputs the counted address to the ROM 46 for outputting the wavelength correction data responsive to the wavelength from the wavelength correction table.

The ROM 46 stores the wavelength correction table setting a number of wavelength correction data pieces (digital data) for correcting the output level of emitted light in the wavelength-variable light source section 41 corresponding to the address input from the counter 45.

That is, the count operation of the counter 45 becomes processing of converting the position signal (rotary encode signal) input from the drive control section 43 into the storage address of wavelength correction value data stored in the wavelength correction table in the ROM 46; the wavelength correction value can be output without using the CPU 106 as in the conventional apparatus.

The D/A converter 47 converts the wavelength correction value data input from the ROM 46 into analog data and outputs the analog data to the LD drive section 48 as a predetermined wavelength correction value.

The LD drive section 48 supplies a drive current to the LD in the wavelength-variable light source section 41 based on a light detection signal input from the light detection section 49 for controlling the output level of emitted light to a constant level. The LD drive section 48 also corrects the drive current so as to correct the light detection characteristic responsive to the wavelength in the light detection section 49 in accordance with the wavelength correction value input from the D/A converter 47 (for example, corrects the amplification factor and the like for amplifying the drive current) and controls the output level of emitted light to a constant level even if the output level of the emitted light from the wavelength-variable light source section 41 is varied.

The light detection section 49 is made up of a lens 49*a* and a light detection element 49*b*. The lens 49*a* emits reference signal input from the wavelength-variable light source section 41 via the optical fiber 50 to the optical connection terminal 52 to the light detection element 49*b* as collimated light. The light detection element 49*b* receives incident light through the lens 49*a* and converts the light into a light detection signal having a predetermined voltage level in response to the received light strength with the light reception sensitivity characteristic responsive to the wavelength, then outputs the light detection signal from a detection terminal 53 via a cable 54 to the LD drive section 48.

Next, the operation of the embodiment will be described.

In the wavelength-variable light source apparatus 40 shown in FIG. 8, first, when the control section 44 outputs a wavelength-variable control signal to the drive control section 43 so as to set an initial wavelength $\lambda 0$, the drive control section 43 outputs a drive control signal to the wavelength-variable drive section 42 and turn and move of the pulse motor in the wavelength-variable drive section 42 to the initial position are started. At this time, in the wavelength-variable light source section 41, the mechanical position of the optical filter forming a part of the external resonator is moved to the initial position by the wavelength-variable drive section 42, whereby the external resonance condition is initialized and the LD drive section 48 supplies a predetermined drive current to the LD, whereby light of the initial wavelength $\lambda 0$ based on the initial external resonance condition is emitted to the outside as output light and to the light detection section 49 as reference light by means of the optical fiber 50.

The control section 44 checks that the emitted light is set to the initial wavelength $\lambda 0$ based on the position signal (rotary encode signal) input from the drive control section 43, then causes the drive control section 43 to stop the drive control. Next, when the control section 44 outputs a wavelength-variable control signal to the drive control section 43 so as to set the initial wavelength $\lambda 0$ to any variable wavelength $\lambda 1$, the drive control section 43 outputs a drive control signal to the wavelength-variable drive section 42 and turn and move of the pulse motor in the wavelength-variable drive section 42 to the set position corresponding to the wavelength $\lambda 1$ are started.

At this time, in the wavelength-variable light source section 41, the mechanical position of the optical filter forming a part of the external resonator is moved from the initial position to the set position corresponding to the wavelength $\lambda 1$ by the wavelength-variable drive section 42, whereby the external resonance condition is set to the wavelength $\lambda 1$ state and the LD drive section 48 supplies a predetermined drive current to the LD, whereby light of the wavelength $\lambda 1$ based on the external resonance condition of the wavelength $\lambda 1$ is emitted to the outside as output light and to the light detection section 49 as reference light by means of the optical fiber 50.

The operation of correcting the drive current supplied from the LD drive section 48 to the wavelength-variable light source section 41 when the emitted light is set to the wavelength $\lambda 1$ will be described based on a signal flow among the blocks of the drive control section 43, the counter 45, the ROM 46, the D/A converter 47, and the LD drive section 48 shown in FIG. 9.

When the pulse motor is moved so that the wavelength of emitted light is set to $\lambda 1$ in the wavelength-variable drive section 42, a rotary encode signal responsive to the move distance is fed back into the drive control section 43, which then outputs a position signal shaped as shown in FIG. 9 responsive to the input rotary encode signal to the counter 45, which then counts an eight-bit address as shown in FIG. 9 in response to the number of pulses set in the position signal input from the drive control section 43 and outputs the count to the ROM 46.

The lower four bits of the eight-bit address counted by the counter 45 are used for the addressing timing in the ROM 46 and the D/A conversion timing in the D/A converter 47, and the upper four bits are used to specify the storage address of wavelength correction data stored in the wavelength correction table in the ROM 46.

Therefore, the correspondences among the position signal indicating the pulse motor move position in the wavelength-variable drive section 42 (corresponding to the optical filter move position), the address counted by the counter 45, and wavelength correction data stored in the wavelength correction table in the ROM 46 are previously measured and set.

In the ROM 46, when the storage address in the wavelength correction table indicated on the upper four bits of the address input from the counter 45 is specified at the input timing of the lower four bits, the same storage address is specified repeatedly every lower four bits; the storage address is specified reliably. The wavelength correction data corresponding to the current wavelength λ1 is read from the specified address in the wavelength correction table in the ROM 46 and is output to the D/A converter 47, which converts the wavelength correction data into analog data at the input timing of the lower four bits of the address input from the counter 45 and outputs the analog data to the LD drive section 48 as the wavelength correction value corresponding to the wavelength λ1.

Next, the LD drive section 48 corrects the drive current so as to correct the light detection characteristic responsive to the wavelength λ1 in the light detection section 49 in accordance with the wavelength correction value corresponding to the wavelength λ1 input from the D/A converter 47 and corrects the amplification factor for amplifying the drive current for controlling the output level of light of the wavelength λ1 emitted from the wavelength-variable light source section 41 to a constant level.

Even if the wavelength λ of the light emitted from the wavelength-variable light source section 41 is varied to any other wavelength λn in the variable range (minimum wavelength λ0 to maximum wavelength λMAX), likewise the address corresponding to the position signal is output from the counter 45 to the ROM 46 and the wavelength correction data corresponding to the wavelength λn is output from the ROM 46 to the D/A converter 47. The LD drive section 48 corrects the drive current so as to correct the light detection characteristic responsive to the wavelength λn in the light detection section 49 in accordance with the wavelength correction value corresponding to the wavelength λn input from the D/A converter 47 and corrects the amplification factor for amplifying the drive current for controlling the output level of light of the wavelength λn emitted from the wavelength-variable light source section 41 to a constant level.

Figure 11:
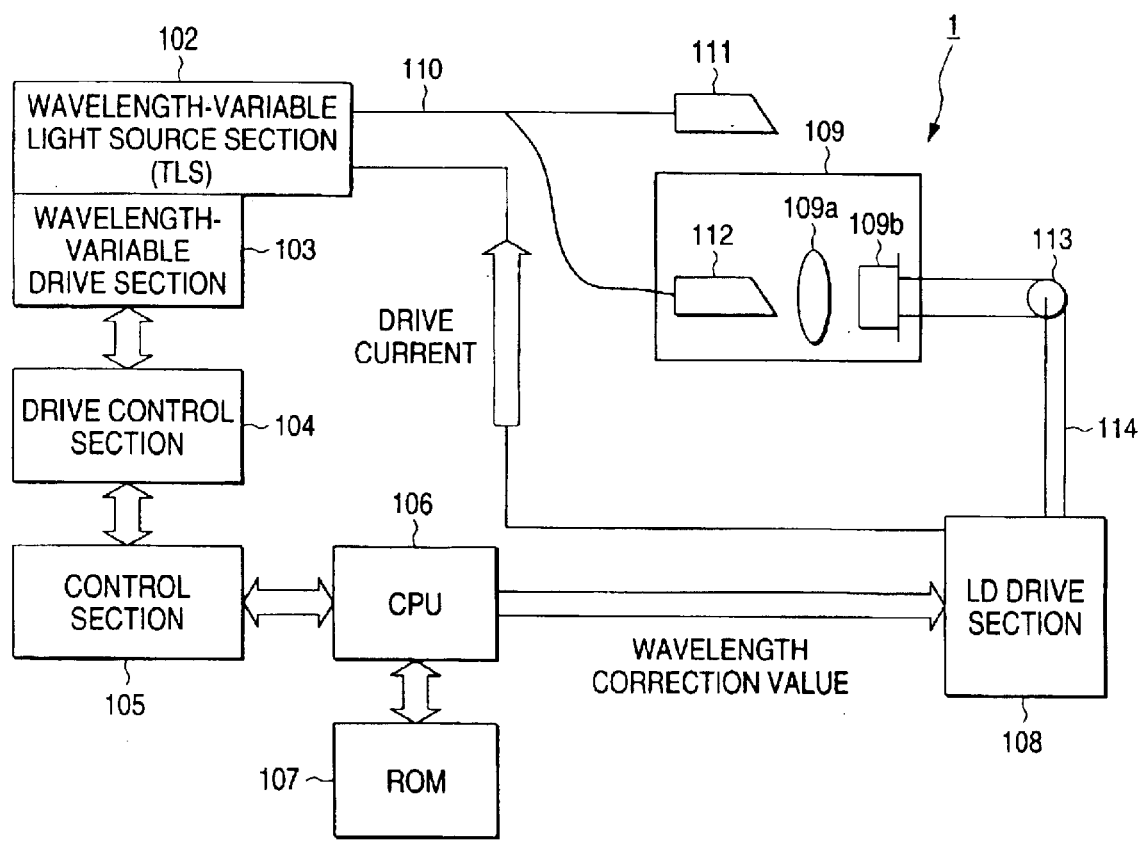
FIG. 11 is a block diagram to show the configuration of a control system in a conventional wavelength-variable light source apparatus.

Thus, in the wavelength-variable light source apparatus 40 in the embodiment, the address of wavelength correction data previously stored in the wavelength correction table in the ROM 46 is specified by the counter 45 counting the storage address corresponding to the move position signal of the pulse motor in the wavelength-variable drive section 42, so that the need for read processing of a wavelength correction value from the ROM 107 by the CPU 106 as in the conventional wavelength-variable light source apparatus 101 shown in FIG. 11 can be eliminated and the CPU 106 can also be made unnecessary.

Therefore, with the wavelength-variable light source apparatus, the function of controlling the output level of emitted light to a constant level in response to a variable wavelength without using any CPU can be provided at low costs.

Figure 10:
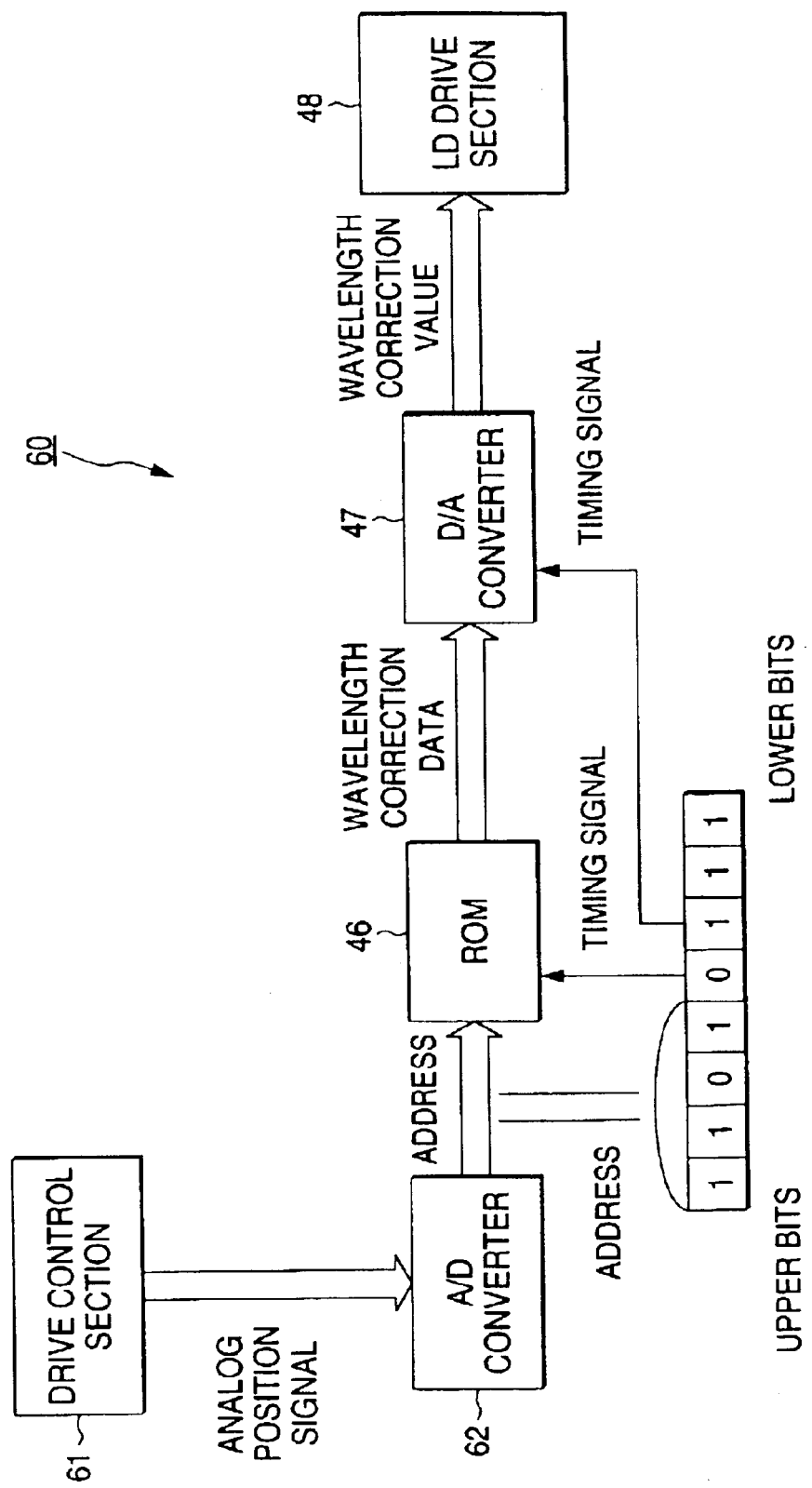
FIG. 10 is a block diagram to show the main part configuration of a control system in a wavelength-variable light source apparatus in still another embodiment incorporating the invention.

In the embodiment, the position signal output from the drive control section 43 to the counter 45 is a digital signal; the main part configuration of a control system required when the position signal is an analog signal is shown as a wavelength-variable light source apparatus 60 in FIG. 10.

The wavelength-variable light source apparatus 60 shown in FIG. 10 differs from the wavelength-variable light source apparatus 40 in that the position signal output from a drive control section 61 is an analog signal or that an A/D converter 62 is used in place of the counter 45; they are the same in the ROM 46, D/A converter 47, LD drive section 48, wavelength-variable light source section 41 (not shown), wavelength-variable drive section 42 (not shown), and light detection section 49 (not shown).

In the wavelength-variable light source apparatus 60, when an analog position signal is input from the drive control section 61 to the A/D converter 62, it is converted into digital eight-bit address data shown in FIG. 10 like that shown in FIG. 9 and the address data is output to the ROM 46. Then, as in the above-described embodiment, the storage address of wavelength correction data stored in a wavelength correction table in the ROM 46 is specified at the input timing of the upper four bits of the address and the wavelength correction data corresponding to the wavelength λ of the light being emitted from the wavelength-variable light source section 41 is output to the D/A converter 47.

The D/A converter 47 converts the wavelength correction data into analog data at the input timing of the lower four bits of the address input from the A/D converter 62 and outputs the analog data to the LD drive section 48 as the wavelength correction value corresponding to the wavelength λ. The LD drive section 48 corrects the drive current so as to correct the light detection characteristic responsive to the wavelength λ in the light detection section 49 in accordance with the wavelength correction value corresponding to the wavelength λ input from the D/A converter 47 and corrects the amplification factor for amplifying the drive current for controlling the output level of light of the wavelength λ emitted from the wavelength-variable light source section 41 to a constant level.

Therefore, with the wavelength-variable light source apparatus 60, the function of controlling the output level of emitted light to a constant level in response to a variable wavelength without using any CPU can be provided at low costs.

What is claimed is:

1. A wavelength-variable light source apparatus comprising:

a semiconductor laser light source section;

an external resonance section for externally resonating emitted light from said semiconductor laser light source section at a predetermined wavelength;

a drive section for varying an external resonance condition in said external resonance section;

a control section for controlling the external resonance condition in said drive section, said control section outputting a control signal for controlling the external resonance condition;

a light detection section for detecting a light output level of the emitted light from said semiconductor laser light source section;

a light source drive control section for correcting a drive signal supplied to said semiconductor laser light source section based on the light output level detected by said light detection section or controlling the light output level to a constant level;

a storage section for storing a wavelength correction value corresponding to the wavelength of the emitted light from said semiconductor laser light source section; and a count section, not controlled by a CPU, for counting an address for reading the wavelength correction value stored in said storage section based on the control signal output from said control section, wherein said light source drive control section corrects the drive signal supplied to said semiconductor laser light source section based on the wavelength correction value read from said storage section according to the address counted by said count section for controlling the light output level to a constant level.

2. The wavelength-variable light source apparatus as claimed in claim 1, wherein said count section counts the address with a bit string consisting of a predetermined number of bits based on the control signal and outputs the counted bit string separated into address specification bits and read timing bits to said storage section for controlling address specification and read timing of the wavelength correction value in said storage section.

3. A wavelength-variable light source apparatus comprising:
- a semiconductor laser light source section;
- an external resonance section for externally resonating emitted light from said semiconductor laser light source section at a predetermined wavelength;
- a drive section for varying an external resonance condition in said external resonance section;
- a control section for controlling the external resonance condition in said drive section, said control section outputting an analog control signal for controlling the external resonance condition;
- a light detection section for detecting a light output level of the emitted light from said semiconductor laser light source section;
- a light source drive control section for correcting a drive signal supplied to said semiconductor laser light source section based on the light output level detected by said light detection section for controlling the light output level to a constant level;
- a storage section for storing a wavelength correction value corresponding to the wavelength of the emitted light from said semiconductor laser light source section; and
- an address generation section for converting the analog control signal output from said control section into a digital signal and generates an address for reading the wavelength correction value stored in said storage section,
- wherein said light source drive control section corrects the drive signal supplied to said semiconductor laser light source section based on the wavelength correction value read from said storage section according to the address generated by said address generation section for controlling the light output level to a constant level.

4. The wavelength-variable light source apparatus as claimed in claim 3, wherein said address generation section converts the analog control signal into a digital signal, generates the address with a bit string consisting of a predetermined number of bits, and outputs the generated bit string separated into address specification bits and read timing bits to said storage section for controlling address specification and read timing of the wavelength correction value in said storage section.

* * * * *